(12) United States Patent
Yang

(10) Patent No.: US 6,844,675 B2
(45) Date of Patent: Jan. 18, 2005

(54) ORGANIC LIGHT EMITTING DIODE DISPLAY WITH AN INSULATING LAYER AS A SHELTER

(75) Inventor: Chien-Sheng Yang, Taipei (JP)

(73) Assignee: AU Optronics Corp., Hsinchu (TW)

( * ) Notice: Subject to any disclaimer, the term of this patent is extended or adjusted under 35 U.S.C. 154(b) by 61 days.

(21) Appl. No.: 10/446,102

(22) Filed: May 28, 2003

(65) Prior Publication Data
US 2004/0140761 A1 Jul. 22, 2004

(30) Foreign Application Priority Data
Jan. 21, 2003 (TW) .......................... 92101265 A

(51) Int. Cl.$^7$ .................................................. H01J 1/62
(52) U.S. Cl. .................. 313/506; 313/504; 313/310
(58) Field of Search ................. 313/310, 498, 313/504, 506

(56) References Cited

U.S. PATENT DOCUMENTS 6,429,580 B1 * 8/2002 Kobayashi et al. ......... 313/310

* cited by examiner

*Primary Examiner*—Vip Patel
(74) *Attorney, Agent, or Firm*—Troxell Law Office PLLC

(57) ABSTRACT

An organic light emitting diode (OLED) structure, and corresponding method of making same are provided. Each OLED pixel includes a first electrode layer on a substrate, a second electrode layer on a substrate, and an organic emission layer disposed between the first and second electrode layers so as to emit visible light when a suitable potential is applied thereto by the electrodes. In accordance with certain embodiments of this invention, a coverage layer is provided over the edge portion of the first electrode layer in order to control the emission region thereby improving the uniformity of image manifestation.

13 Claims, 3 Drawing Sheets

ORGANIC LIGHT EMITTING DIODE DISPLAY WITH AN INSULATING LAYER AS A SHELTER

BACKGROUND OF THE INVENTION (1) Field of the Invention

The invention relates to an organic light emitting diode (OLED) display, and a method of making same. More particularly, this invention relates to an OLED structure including an insulating layer which functions to control the light emission region of each pixel thereby improving the uniformity of image manifestation.

(2) Description of the Prior Art

Owing to high brightness, fast response speed, light weight, thin and small features, full color, no viewing angle differences, no need for an LCD back-light board and low electrical consumption, an organic light emitting diode display or organic electroluminescence display (OLED) takes the lead to substitute a twist nematic (TN) or a super twist nematic (STN) liquid crystal display. Further, it substitutes for a small-sized thin-film transistor (TFT) LCD to become a new display material of fabricating portable information products, cell phones, personal digital assistant (PDA) and notebook.

Conventional OLED display structures are built on glass substrate in a manner such that a two-dimensional OLED array for image manifestation is formed. Each OLED in the array, referring to FIG. 1, generally includes overlaying layers starting with a light transmissive first electrode 12 formed on the substrate, an organic electroluminescent (EL) emission medium 10 deposited over the first electrode 12, and a metallic electrode 14 on top of the organic electroluminescent emission medium 10. When an electrical potential is placed across the electrodes, holes and electrons are injected into the organic zones from the anode and cathode, respectively. Light emission results from hole-electron recombination within the device.

As shown in FIG. 2, conventionally, the first step for manufacturing OLED display is to evaporate or sputter light transmissive first electrodes 102 (e.g. of indium-tin-oxide or ITO) on a glass substrate 100. Then an emission layer 116 (e.g. of organic electroluminescent medium) is evaporated on the electrode 102 by using a shadow mask 112 which has been defined holes thereon. This is because all the holes have same size "T" that all the emission layer blocks have same size. However, the realistic condition is the shadow mask 112 may droop causing of temperature, weight, etc. Then each hole may not have same size (e.g. $T_1'T_2'T_3'$ as shown in FIG. 2) that the emission layer blocks result to different size. Consequently, each pixel of light emission region is changed and result in a problem of non-uniformity and bad quality of image manifestation. Thus, to solve the above-mentioned problem is the most important issue nowadays.

It is a purpose of this invention to fulfill the above described needs in the art, as well as other needs which will become apparent to the skilled artisan from the following detailed description of this invention.

SUMMARY OF THE INVENTION

The primary objective of the present invention is to provide an organic light emitting diode display device with an insulating layer to precisely control the light emission region and improving the uniformity of image manifestation.

The present invention is directed to an organic light emitting diode display having an insulating layer to function as a shelter. Before the steps of depositing the emission layer, defining an insulating layer for controlling the light emission region. Then even if every size of the organic layer is evaporated over the first electrodes are changed. The light emission region is limited by the predetermined size precisely controlled by the insulating layer so as to maintain the uniformity of image manifestation.

In manufacturing the present invention, the first electrodes are deposited and patterned on the substrate firstly. Next, the insulating layer is deposited over the first electrodes on the substrate. Then an etching procedure is done to etch the insulating layer for defining several predetermined apertures to expose each central portion of first electrodes. Subsequently, the emission layer is deposited above the substrate to cover the first electrodes. Finally, the second electrodes are deposited and patterned on the emission layer. This is because the insulating layer covers partial first electrodes that the light emitting of the emission layer is limited by and equal to predetermined apertures.

BRIEF DESCRIPTION OF THE DRAWINGS

The present invention will now be specified with reference to its preferred embodiment illustrated in the drawings, in which.

DESCRIPTION OF THE PREFERRED EMBODIMENT

The invention disclosed herein is an OLED structure including an insulating layer which functions to control the light emission region of each pixel thereby improving the uniformity of image manifestation. In the following description, numerous details are set forth in order to provide a thorough understanding of the present invention. It will be appreciated by one skilled in the art that variations of these specific details are possible while still achieving the results of the present invention. In other instance, well-known components are not described in detail in order not to unnecessarily obscure the present invention.

Figure 1:
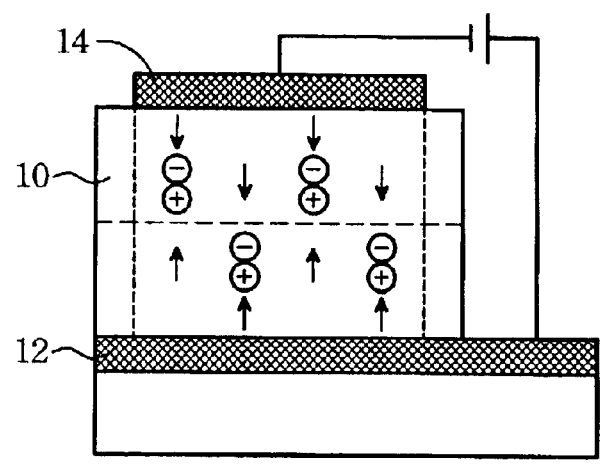
FIG. 1 is a schematic view of a basic structure of the organic light emitting diode (OLED) device.
Figure 2:
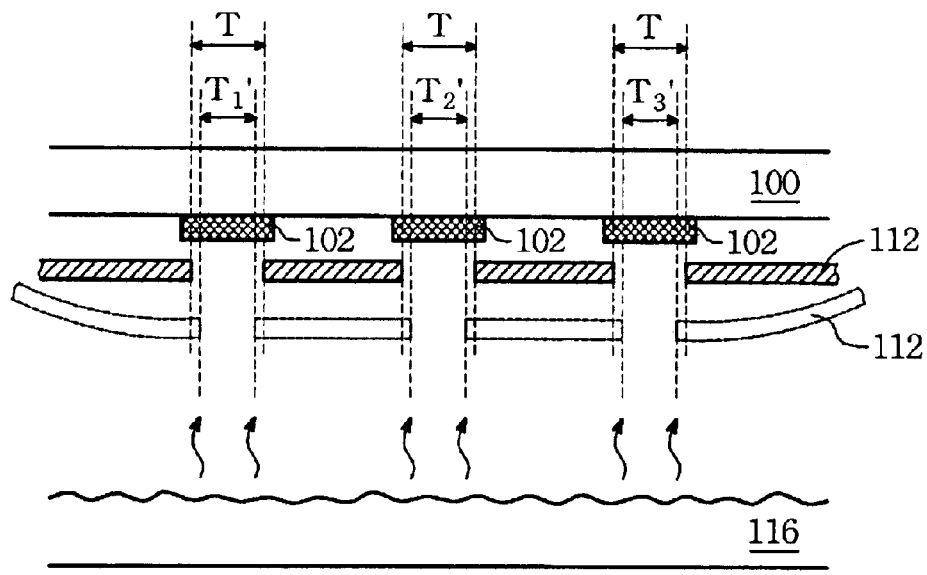
FIG. 2 is a schematic view of depositing the emission layer on the surface of the electrode in accordance with the prior art.
Figure 3:
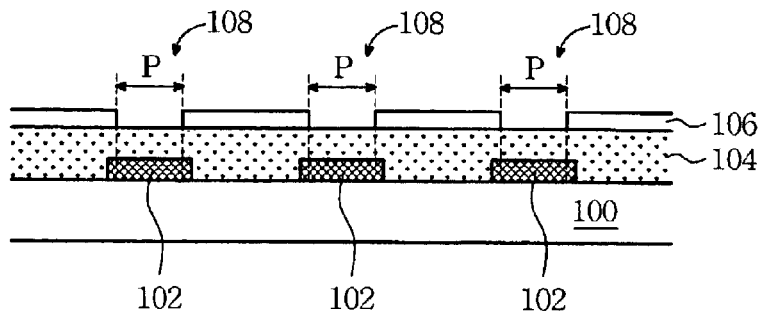
FIG. 3 is a cross sectional view of the transparent substrate illustrating the steps of forming the first electrodes, the insulating layer, and the photo-resist layer in accordance with the present invention.

Referring to FIG. 3, in the present invention, a plurality of first electrodes 102 are formed on a transparent substrate 100 (e.g. of glass, plastic, or the like) by performing a PVD or CVD procedure such as sputtering, electron beam evaporation, thermal evaporation deposition, or spray pyrolysis. And the conductive electrode layer can be chosen from metal such as magnesium(Mg), aluminum(Al), lithium (Li), alloy and any combination thereof or transparent conductive material such as indium-tin-oxide(ITO) and indium-zinc-oxide(IZO). Then performing a photolithography and an etching procedure for patterning the first electrodes 102 on the transparent substrate 100.

Subsequently, an insulating layer 104 is deposited over the transparent substrate 100 and the first electrodes 102. In general, the insulating layer 104 can be chosen from the group of oxide, nitride, or the like(e.g. of $SiO_2$, $SiN_x$ and SiON). In a preferred embodiment, the insulating layer 104 is formed of silicon oxide layer by applying a chemical vapor deposition(CVD) process. Then a photo-resist layer is coated on the insulating layer 104. And the photo-resist layer is precisely defined by exposing and developing procedures to form photo-resist pattern 106 on the insulating layer 104. Such that the aperture regions 108 with predetermined size "P" are formed within the photo-resist pattern 106.

Figure 4:
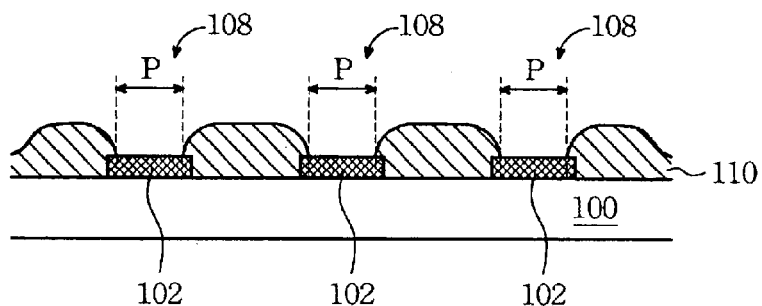
FIG. 4 is a cross sectional view of the transparent substrate illustrating the steps of defining apertures within the insulating layer.

Then the photo-resist pattern 106 is applied to serve as an etching mask for performing an anisotropic etch to the insulating layer 104. Such that the aperture regions 108 are formed within the insulating layer 104 and then each central portion of first electrodes 102 are exposed. And the insulating layer 110 is defined with several aperture regions 108 and each one has a predetermined size "P." Next, removing the photo-resist pattern 106, as shown in FIG. 4.

After the aperture regions 108 have been formed, an emission layer 118 is deposited in blanket form over substantially the entire substrate. And the emission layer 118 is an organic electroluminescent medium which can be chosen from the group of Alq, DPT, DCM-2, TMS-SiPc, TPAN, DPAN and TTBND/BTX-1, etc. The steps of depositing the emission layer 118 comprise of, turning over the substrate first, and then disposing a shadow mask 112 which has been defined with several holes 114 beneath the substrate. Each hole 114 has a predetermined size "S". As the deposition is proceeding, the organic material 116 can be coated through the holes 114 and onto the first electrodes 102. However, the deposition method can be selected from Electron Beam Evaporation, Thermal Evaporation, Dip Coating, Spin Coating, Langmuir-Blodgett method and Sol-Gel method, etc.

Figure 5:
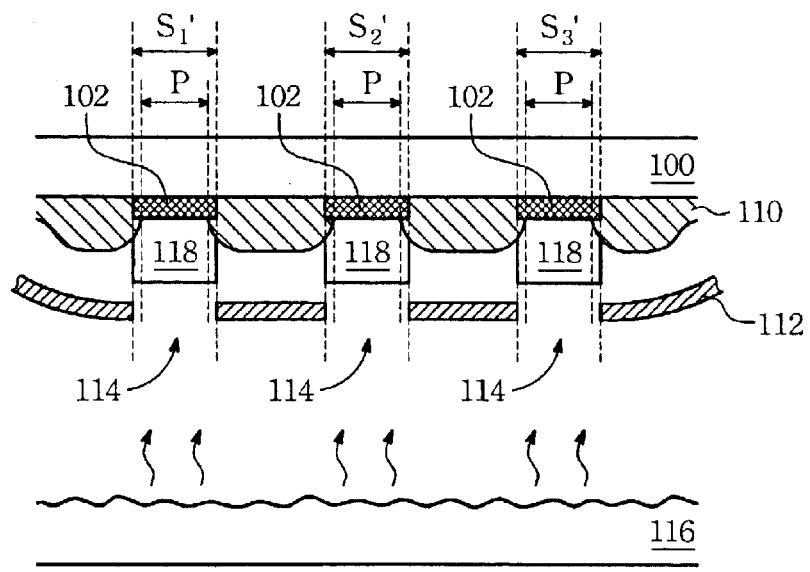
FIG. 5 is a schematic view of depositing the emission layer on the surface of the electrode in accordance with the present invention.

Owing to the shadow mask 112 might droop causing of temperature or weight such that every hole 114 formed thereon might change their size too. Originally, each hole 114 has been defined with same predetermined size "S." But, in real case, each hole 114 might have different sizes(e.g. $S_1'$ $S_2'S_3'$ as illustrated in FIG. 5). Unavoidably, the size of the emission layer 118 which is deposited through the holes 114 must change too(e.g. $S_1'S_2'S_3'$ as illustrated in FIG. 5).

Figure 6:
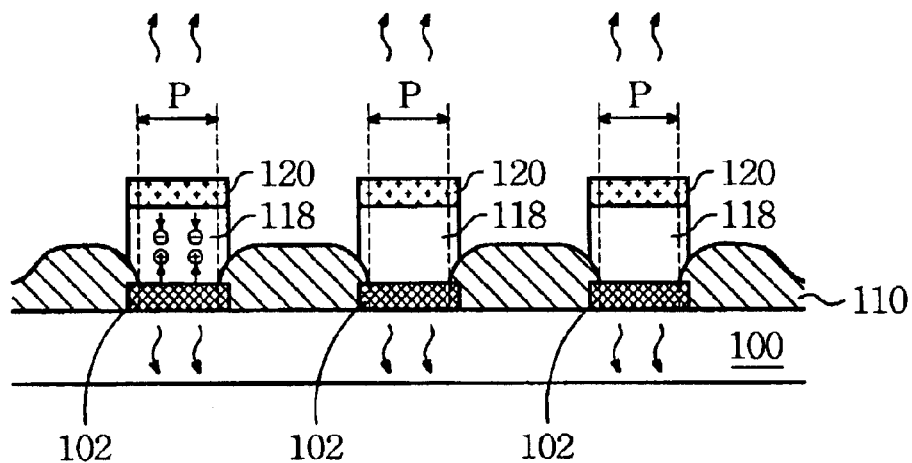
FIG. 6 is a cross sectional view of the transparent substrate illustrating the steps of forming the second electrodes on the surface of the emission layer in accordance with the present invention.

Eventually, the second electrodes 120 are deposited on the emission layer 118, as shown in FIG. 6. And the conductive electrode layer can be chosen from metal such as magnesium(Mg), aluminum(Al), lithium(Li), alloy and any combination thereof or transparent conductive material such as indium-tin-oxide(ITO) and indium-zinc-oxide(IZO). Then performing a photolithography and an etching procedure for patterning the second electrodes 120 on the emission layer 118.

Figure 7:
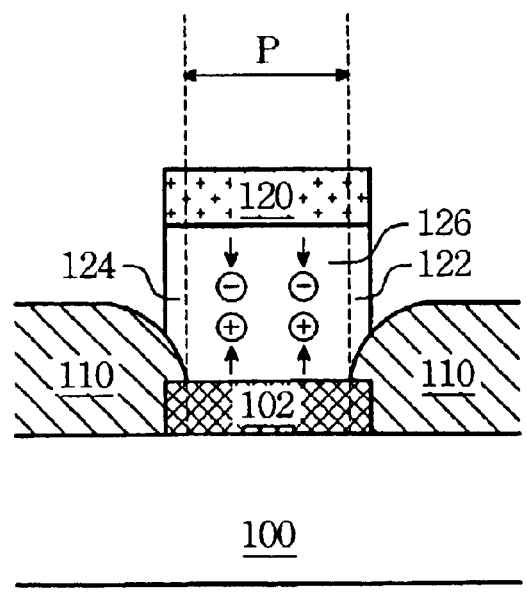
FIG. 7 is a schematic view of the insulating layer which limits the emission region of the OLED device in accordance with the present invention.

Referring to FIG. 7, as applying an electrical potential between the first electrode 102 and the second electrode 120, holes and electrons are injected into the organic zone from the anode and cathode, respectively. Light emission results from hole-electron recombination within the organic zone. At this moment, the portions of the organic medium coated on the insulating layer 110 are blocked by the insulating layer 110 that these region will lack of the hole-electron recombination phenomenon. Without the recombination phenomenon no light emitting are occurred from these region 122 and 124. It is understood that the light emission region 126 is limited in the predetermined size "P" which is controlled by the insulating layer 110 as shown in FIG. 7.

The foregoing is illustrative of the present invention and is not to be construed as limiting thereof. Although a few exemplary embodiments of this invention have been described, those skilled in the art will readily appreciate that many modifications are possible in the exemplary embodiments without materially departing from the novel teachings and advantages of this invention. Accordingly, all such modifications are intended to be included within the scope of this invention as defined in the claims. Therefore, it is to be understood that the foregoing is illustrative of the present invention and is not to be construed as limited to the specific embodiments disclosed, and that modifications to the disclosed embodiments, as will as other embodiments, are intended to be included within the scope of the appended claims. The invention is defined by the following claims, with equivalents of the claims to be included therein.

I claim:

1. An organic light emitting diode (OLED) comprising:

a transparent substrate;

a plurality of first electrodes provided on said transparent substrate;

an insulating layer provided on said plurality of first electrodes and said transparent substrate, wherein said insulating layer has a plurality of predetermined apertures to expose each central portion of said plurality of first electrodes;

an emission layer provided on said insulating layer and filled up said plurality of predetermined apertures thereof; and a plurality of second electrodes provided on said emission layer;

wherein said insulating layer covers partial said plurality of first electrodes that the light emitting of said emission layer is limited by and equal to said plurality of predetermined apertures.

2. The OLED of claim 1, wherein the transparent substrate is made of a plastic.

3. The OLED of claim 1, wherein the transparent substrate is made of a glass.

4. The OLED of claim 1, wherein said plurality of first electrodes and said plurality of second electrodes are selected from the group consisting of ITO and IZO.

5. The OLED of claim 1, wherein said plurality of first electrodes and said plurality of second electrodes are selected from the group consisting of Mg, Li and Al.

6. The OLED of claim 1, wherein said insulating layer is selected from the group consisting of $SiO_2$, $SiN_x$ and SiON.

7. The OLED of claim 1, wherein said emission layer is selected from the group consisting of Alq, DPT, DCM-2, TMS-SiPc, TPAN, DPAN and TTBND/BTX-1.

8. A method of manufacturing an organic light emitting diode (OLED), the method comprises the following steps of:

providing a transparent substrate;

depositing and patterning a plurality of first electrodes on said transparent substrate;

depositing an insulating layer on said plurality of first electrodes and said transparent substrate;

performing an etching procedure to said insulating layer for defining a plurality of predetermined apertures thereon to expose each central portion of said plurality of first electrodes;

depositing an emission layer to cover said plurality of first electrodes; and depositing and patterning a plurality of second electrodes on said emission layer;

wherein said insulating layer covers partial said plurality of first electrodes that the light emitting of said emission layer is limited by and equal to said plurality of predetermined apertures.

9. The method of claim 8, wherein said etching procedure further comprises the steps of:

depositing and patterning a photo-resist layer on said insulating layer for defining said plurality of predetermined apertures;

etching said insulating layer by using said photo-resist layer as a mask for removing partial said insulating layer; and removing said photo-resist layer.

10. The method of claim 8, wherein said steps of depositing said emission layer is through a shadow mask.

11. The method of claim 10, wherein said steps of depositing method is selected from the group consisting of Electron Beam Evaporation, Thermal Evaporation, Dip Coating, Spin Coating, Langmuir-Blodgett method and Sol-Gel method.

12. The method of claim 8, wherein said steps of depositing said plurality of first electrodes and said plurality of second electrodes are performed by a method selected from the group consisting of Sputtering, Electron Beam Evaporation, Thermal Evaporation Deposition, Chemical Vapor Deposition and Spray Pyrolysis.

13. The method of claim 8, wherein said emission layer covers said insulating layer which is around said plurality of first electrodes.

* * * * *